United States Patent

Nise et al.

Patent Number: 5,995,036
Date of Patent: Nov. 30, 1999

[54] PASSIVE SWITCHED CAPACITOR DELTA ANALOG-TO-DIGITAL CONVERTER WITH PROGRAMMABLE GAIN CONTROL

[75] Inventors: Benjamin E. Nise, Sandy, Utah; Carver A. Mead, Cupertino, Calif.; Xialoing Fang, Draper, Utah

[73] Assignee: Sonic Innovations, Inc., Salt Lake City, Utah

[21] Appl. No.: 09/040,496

[22] Filed: Mar. 17, 1998

[51] Int. Cl.[6] ............................................. H03M 1/12
[52] U.S. Cl. ............................................. 341/172; 341/155
[58] Field of Search ........................... 341/172, 164, 341/120, 168, 155, 159, 156, 165

[56] References Cited

U.S. PATENT DOCUMENTS

| | | | |
|---|---|---|---|
| 3,234,544 | 2/1966 | Marenholtz | 340/347 |
| 3,298,019 | 1/1967 | Nossen | 340/347 |
| 3,509,557 | 4/1970 | Groth | 340/347 |
| 3,582,947 | 6/1971 | Harrison | 340/347 |
| 3,678,501 | 7/1972 | Prill | 340/347 |
| 3,692,959 | 9/1972 | Lamp | 179/175.1 |
| 3,750,142 | 7/1973 | Barnes et al. | 340/347 |
| 4,114,149 | 9/1978 | Kendall | 340/347 |
| 4,200,863 | 4/1980 | Hodges et al. | 341/172 |
| 4,210,903 | 7/1980 | LaBrie | 340/347 |
| 4,243,974 | 1/1981 | Mack | 340/347 |
| 4,291,300 | 9/1981 | Bade | 340/347 |
| 4,590,459 | 5/1986 | Lanz et al. | 340/347 |
| 4,602,337 | 7/1986 | Cox | 364/347 |
| 4,696,032 | 9/1987 | Levy | 379/390 |
| 4,701,958 | 10/1987 | Neth | 381/68 |
| 4,739,305 | 4/1988 | Naito | 340/347 |
| 4,773,088 | 9/1988 | Matheny | 379/395 |
| 5,059,981 | 10/1991 | Hauser | 341/164 |
| 5,103,230 | 4/1992 | Kalthoff et al. | 341/166 |
| 5,126,743 | 6/1992 | Hobbs | 341/157 |
| 5,241,310 | 8/1993 | Tiemann | 341/143 |

FOREIGN PATENT DOCUMENTS

| | | | |
|---|---|---|---|
| 44 41 996 | 5/1996 | Germany | H04R 25/00 |
| 195 45 760 | 2/1997 | Germany | H04R 25/00 |

OTHER PUBLICATIONS

Lee et al., "Self–Calibrating 15 Bit CMOS A/D Converter", Dec. 1984, IEEE, J. Solid–State Circuits, vol. SC–19, No. 6, pp. 813, 819.

Primary Examiner—Brian Young
Attorney, Agent, or Firm—D'Alessandro & Ritchie

[57] ABSTRACT

An analog-to-digital converter comprises a modulator connected to an analog input signal, a decimator connected to the output of the modulator, a normalizer connected to the output of the modulator and forming a digital output signal, and a programmable gain control circuit connected to the output of the normalizer and providing feedback gain control to the modulator and the decimator.

2 Claims, 7 Drawing Sheets

|  | GAIN | | 20 BIT FIXED POINT NUMBER | EXP. MANTI. |
|---|---|---|---|---|
| POSITIVE INPUTS | 6 | MAX | 0100,0000,0000,0000,0000 | 01000. 0100000000 |
| | | MIN | 0000,1111,1111,1111,1111 | 00101. 0111111111 |
| | 5 | MAX | 0001,0000,0000,0000,0000 | 00110. 0100000000 |
| | | MIN | 0000,0111,1111,1111,1111 | 00100. 0111111111 |
| | 4 | MAX | 0000,1000,0000,0000,0000 | 00101. 0100000000 |
| | | MIN | 0000,0011,1111,1111,1111 | 00011. 0111111111 |
| | 3 | MAX | 0000,0000,0000,0000,0000 | 00100. 0100000000 |
| | | MIN | 0000,0001,1111,1111,1111 | 00010. 0111111111 |
| | 2 | MAX | 0000,0010,0000,0000,0000 | 00011. 0100000000 |
| | | MIN | 0000,0000,1111,1111,1111 | 00001. 0111111111 |
| | 1 | MAX | 0000,0001,0000,0000,0000 | 00010. 0100000000 |
| | | MIN | 0000,0000,0111,1111,1111 | 00000. 0111111111 |
| | 0 | MAX | 0000,0000,1000,0000,0000 | 00001. 0100000000 |
| | | MIN | 0000,0000,0000,0000,0001 | 10110. 0100000000 |
| ZERO INPUT | 0 | | 0000,0000,0000,0000,0000 | 10000. 0100000000 |
| NEGATIVE INPUTS | 6 | MIN | 1100,0000,0000,0000,0000 | 00111. 1000000000 |
| | | MAX | 1111,0000,0000,0000,0000 | 00101. 1000000000 |
| | 5 | MIN | 1110,0000,0000,0000,0000 | 00110. 1000000000 |
| | | MAX | 1111,1000,0000,0000,0000 | 00100. 1000000000 |
| | 4 | MIN | 1111,0000,0000,0000,0000 | 00101. 1000000000 |
| | | MAX | 1111,1100,0000,0000,0000 | 00011. 1000000000 |
| | 3 | MIN | 1111,1000,0000,0000,0000 | 00010. 1000000000 |
| | | MAX | 1111,1110,0000,0000,0000 | 00010. 1000000000 |
| | 2 | MIN | 1111,1100,0000,0000,0000 | 00011. 1000000000 |
| | | MAX | 1111,1111,0000,0000,0000 | 00001. 1000000000 |
| | 1 | MIN | 1111,1110,0000,0000,0000 | 00010. 1000000000 |
| | | MAX | 1111,1111,1000,0000,0000 | 00000. 1000000000 |
| | 0 | MIN | 1111,1111,0000,0000,0000 | 00001. 1000000000 |
| | | MAX | 1111,1111,1111,1111,1111 | 10101. 1000000000 |

*FIG. 9*

| EXPONENT | CAP. GAIN | DECIMATOR GAIN |
|---|---|---|
| 01000 | 111111 | 1000000 |
| 00111 | 111111 | 1000000 |
| 00110 | 111111 | 1000000 |
| 00101 | 011111 | 0100000 |
| 00100 | 001111 | 0010000 |
| 00011 | 000111 | 0001000 |
| 00010 | 000011 | 0000100 |
| 00001 | 000001 | 0000010 |
| 00000 | 000000 | 0000001 |
| 1XXXX | 000000 | 0000001 |

PASSIVE SWITCHED CAPACITOR DELTA ANALOG-TO-DIGITAL CONVERTER WITH PROGRAMMABLE GAIN CONTROL

BACKGROUND OF THE INVENTION

1. Field of the Invention

The present invention relates to an analog-to-digital converter (ADC). More particularly, the present invention relates to switched capacitor ADC with programmable gain control.

2. The Prior Art

Many techniques are known in the prior art for analog-to-digital (A/D) conversion. Each of these A/D techniques has advantages which correspond to the application in which the A/D conversion is being performed. Choosing the A/D conversion technique to be used in a particular application can depend on the consideration of at least the speed, accuracy, cost, dynamic range and power requirements of the application. The spectrum of A/D conversion techniques available in the prior art generally fall into one of two categories.

In the first category are A/D techniques where the analog input signal is directly compared to a digital reference value. The digital value output from the A/D conversion is equal to the digital reference value which most closely compares to the analog input signal. This category of A/D converters is considered fast, however, to obtain high resolution with A/D techniques in this category is generally expensive. A/D techniques for direct comparison include, for example, parallel encoders and the successive approximation method.

In a parallel encoder, there are a plurality of comparators, each of which has the analog input signal connected to a first input. Comparison of the analog input voltage is made to a reference voltage connected to a second input of each of the comparators. The reference voltages supplied to each of the comparators all have different values. The values of the reference voltages are generally evenly spaced. The reference voltage corresponding most closely to the analog input signal as determined by a priority encoder constitutes the digital output of the A/D converter.

The successive approximation method is essentially a binary search performed by comparing the output of a D/A converter with the analog input signal. The value of the output of the D/A converter is usually set by a most significant bit input to the digital side of the D/A converter. The digital inputs to the D/A converter are changed until the analog output value of the D/A converter matches the value of the analog input signal. In a variation of this method, an up/down counter is used to generate the reference values presented to the digital side of the D/A converter. As the analog input changes, the up/down counter changes the reference values presented to the D/A converter to track the analog input voltage.

In the second category are techniques where the analog input is converted into a second quantity which is then used to represent the digital value corresponding to the analog input signal. The second quantity may be, for example, a pulse train at a frequency which varies to represent the value of the analog signal or a specific count generated for a specified time period, wherein the count is proportional to the analog value of the input signal during the specified time period. These techniques include voltage-to-frequency conversion, single-slope integration, dual-slope integration, and delta-sigma modulation.

In a voltage-to-frequency technique, the analog input controls the frequency of a variable frequency oscillator. The oscillator output charges a capacitor which is compared with the analog input signal. The oscillator frequency is varied until the input levels are the same. The frequency of the oscillator is proportional to the analog input signal.

In a single-slope integration, a ramp voltage is generated, usually by storing charge in a capacitor. During the time period the charge is being stored on the capacitor for comparison with the analog input signal, a counter is operating. When the ramp voltage equals the analog input voltage, the counter is stopped. The value in the counter is proportional to the analog input voltage. In a dual-slope integration, during a first fixed time period a current proportional to the analog input signal charges a capacitor. The charge on the capacitor is then discharged to zero at a constant rate. The length of time taken to discharge the capacitor to zero is proportional to the analog input.

In an A/D converter using prior art delta-sigma modulation techniques, an analog input signal is oversampled and fed into a differential amplifier which operates as a summing junction. The differential amplifier sums the analog input with a feedback signal that is the output of the delta-sigma modulator. The output of the differential amplifier thereby represents the change in the value of the analog input signal from one sample to the next.

By feeding back the output of the delta-sigma modulator into the differential amplifier, the output of the differential amplifier is kept at a zero average signal value. Because of this feature, a delta-sigma modulator is alternatively known in the art as a charge-balancing modulator. The successive outputs of the differential amplifier, which in summation represent a zero average signal value, are fed into an integrator for summation. The output of the integrator is fed into a comparator for comparison with a reference value. The comparators employed in the prior art require both positive and negative power supplies and a very accurate midpoint reference such as ground.

When the integrated value is above the reference value, the output of the delta-sigma modulator is a high value, and a high value is fed back to the differential amplifier. When the integrated value is below the reference value, the output of the delta-sigma modulator is a low value, and a low value is fed back to the differential amplifier. However, because the value of the signal being fed back is either a constant high or low value, the output of the differential amplifier cannot be a full rail-to-rail swing.

The high and low signals are treated as up/down signals which are filtered by a digital filter. The digital filter may be, for example, an up/down counter which accumulates the up/down signals. After processing a selected number of analog cycles, the output of the digital filter is used to determine the digital output of the A/D converter. The digital output is the average value of the analog input signal during the time represented by the selected number of analog samples.

One of the major advantages associated with delta-sigma modulators is that low resolution components can be used to process the analog input signal, and a high resolution digital output can be extracted because the analog input signal is oversampled. However, with the ever increasing use of digital signal processing in many different applications, there exists in delta-sigma modulators a need for greater design simplicity, and lower power requirements.

BRIEF DESCRIPTION OF THE INVENTION

An analog-to-digital converter according to the present invention comprises a modulator connected to an analog input signal, a decimator connected to the output of the modulator, a normalizer connected to the output of the modulator and forming a digital output signal, and a programmable gain control circuit connected to the output of the normalizer and providing feedback gain control to the modulator and the decimator.

According to a first aspect of the present invention, the modulator includes a comparator having a first input, a second input, and an output, a reference potential connected to the first input of the comparator and connectable to the second input of the comparator by first switch, an input storage element having a first terminal connected to the input of the analog-to-digital converter, and a second terminal connectable to the second input of the comparator by a second switch, a first bank of storage elements, each of the storage elements having a first terminal connected to the second input of the comparator, and a second terminal connected to a separate switch in a bank of switches, the bank of switches making selected ones of the storage elements connectable to either a charge or discharge potential.

According to a second aspect of the present invention, the decimator includes a shift register having a first input connected to the comparator output, and a second input connected to a feedback gain proportional to the output of the analog-to-digital converter to control the shift register, and an output, a first accumulator having an input connected to the output of the shift register, and an output, a second accumulator having an input connected to the output of the first accumulator, and an output, a delay element having an input connected to the output of the second accumulator, and an output, a differentiator having a first input connected to the output of the delay element and a second input connected to the output of the second accumulator, and an output.

According to a third aspect of the present invention, the normalizer has an input connected to the output of the decimator for mapping the decimator output from a first number format to a second number format at an output.

According to a fourth aspect of the present invention, the programmable gain control circuit has an input connected to the output of the normalizer, and a first output connected to the bank of switches in the modulator to adjust the gain in the modulator, and a second output connected to the decimator to adjust the gain of the decimator.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1:
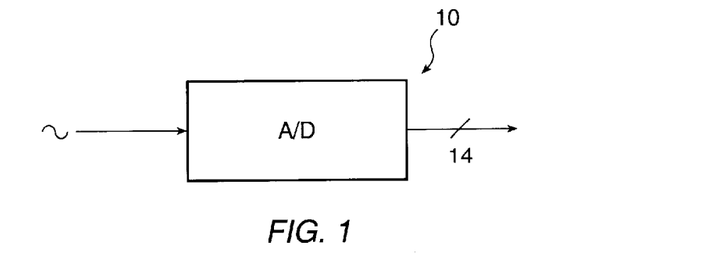
FIG. 1 illustrates an analog-to-digital converter (ADC) according to the present invention.
Figure 2:
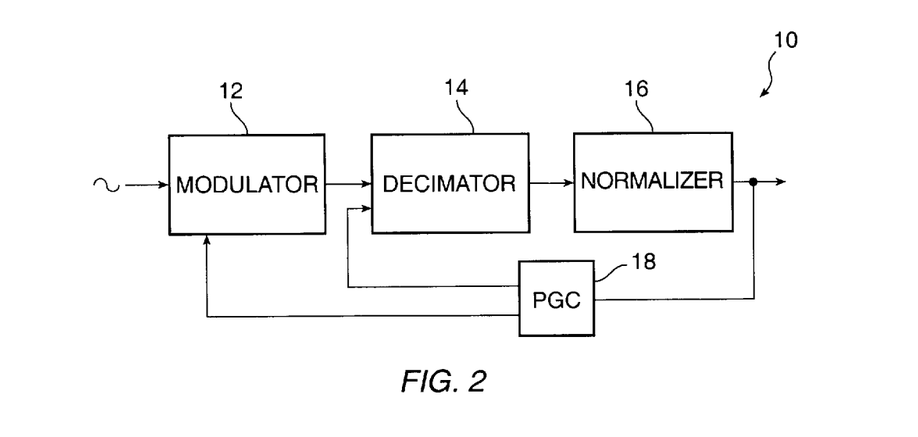
FIG. 2 illustrates a block diagram of an analog-to-digital converter (ADC) according to the present invention.

According to the present invention, as depicted in FIG. 1, an analog to digital converter (ADC) is illustrated as having an analog input and a 14 bit floating point digital output comprising 1 bit of sign, 8 bits of mantissa, and 5 bits of exponent. According to alternatively preferred embodiments of the present invention, the analog input signal may be obtained from a microphone or a telecoil. The ADC 10 is illustrated in FIG. 2 in a block diagram as a modulator 12, a decimator 14, a normalizer 16, and a programmable gain control (PGC) circuit 18.

The input of the modulator 12 forms the input of the ADC 10, and the output of the modulator 12 is connected to the input of the normalizer 16. The output of the normalizer 16 forms the output of the ADC 10, and is also connected to the input of the PGC circuit 18. The output of the PGC circuit 18 is connected to both the modulator 12 and the decimator 14. The output of the PGC circuit 18 provides programmable gain control to the modulator 12, and provides automatic selection of front end gain to the decimator 14.

In the operation of the ADC 10 the difference between successive samples of the amplitude of the analog signal forms the input to the ADC 10. The sampling rate of the analog input signal by modulator 12 is 1.28 MHz. The modulator 12, to be described below, outputs a bit stream in response to the analog input signal. The decimator 14, also to be described below, operates on the bit stream provided by the modulator 12 to form a 20 bit fixed point digital output at a rate of 20 kHz. The normalizer 16 maps the 20 bit output of the decimator 14 to form the 14 bit floating point number output of the ADC 10, including 8 bits of mantissa, 1 bit of sign, and 5 bits of exponent. The five exponent bits output from the normalizer 16 represent the envelope of the analog input signal. These five exponent bits are fed into the PGC circuit 18, to be described below, to form a six bit gain value that is then fed back to both the modulator 12 and the decimator 16.

Figure 3:
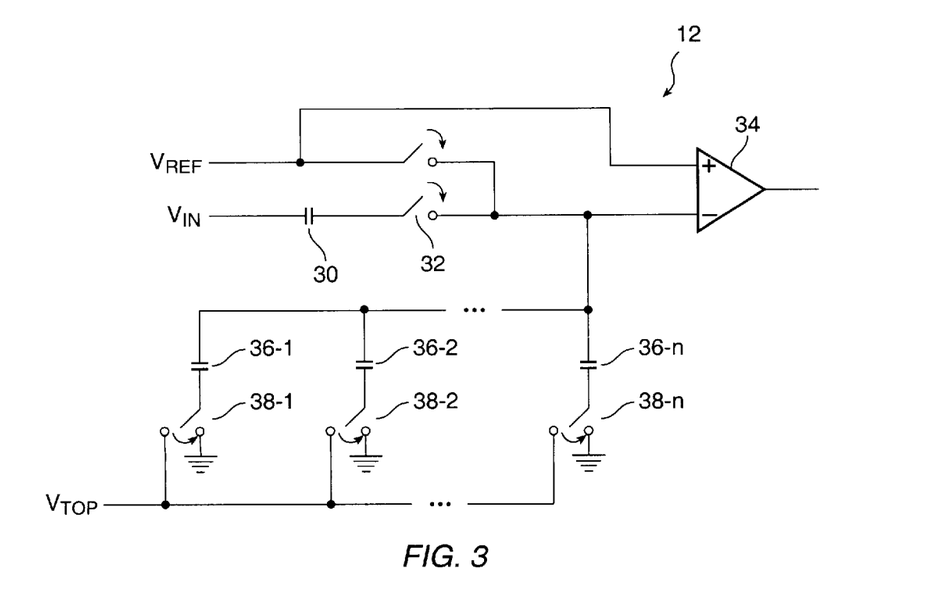
FIG. 3 illustrates the circuit diagram of a modulator suitable for use according to the present invention.

Turning now to FIG. 3, the modulator 12 is shown in greater detail. In the modulator 12, an external capacitor 30 has a first side connected to the analog input signal, which according to the preferred embodiment is a voltage signal. The second plate of capacitor 30 is connected to a switch 32, which in the preferred embodiment is a MOS transistor. Switch 32 connects the capacitor 30 to the inverting input of a comparator 34. The node formed at the inverting input of comparator 34 is called the balance node. Connected in parallel to the balance node is a bank of capacitors 36-1 through 36-n. One side of each of the capacitors 36-1 through 36-n is connected to the balance node, and each of the second plates of capacitors 36-1 through 36-n is connected to a switch 38-1 through 38-n.

In the preferred embodiment, the switches 38-1 through 38-n are MOS transistors. The switches 38-1 through 38-n can connect the capacitors 36-1 through 36-n to either a voltage, $V_{top}$ or to ground. In this manner, the switches 38-1 through 38-n can either charge the capacitors 36-1 through 36-n or discharge them to ground. The switches 38-1 through 38-n are controlled by the six bit output of the PGC circuit 18.

In the operation of the modulator 12, the charge on external capacitor which is coupled to the inverting input of comparator 34 is balanced or compensated for by the charge on the bank of capacitors 36-1 through 36-n. The inverting input after being balanced, is compared with a reference voltage, $V_{ref}$, connected to the non-inverting input of comparator 34. The output of the comparison appears at the output of comparator 34. The amount of charge deposited on the balance node by the bank of capacitors 36-1 through 36-n, either positive or negative, depends on the output of the previous comparison.

For example, if the previous output was increasing, the output of comparator 34 would indicate that the voltage on the inverting input is greater than $V_{ref}$. As a result, in the subsequent cycle, charge would be withdrawn from the inverting input of comparator 34 by connecting more of the capacitors 36-1 through 36-n to ground to bring the voltage at the inverting input of comparator 34 closer to the reference voltage at the non-inverting input of comparator 34. Accordingly, a closed loop is formed between the balance node, the comparator 34, and the capacitor bank 36-1 through 36-n such that the balance node is kept close to the voltage level of $V_{ref}$. Further, if the input voltage is changing quickly, large capacitors in the capacitor bank 36-1 through 36-n are selected, and when the input voltage is changing slowly, smaller capacitors in the capacitor bank 36-1 through 36-n are selected. The sampling of the analog input signal $V_{in}$ occurs at a 1.28 MHz by opening and closing the switch 32. The comparison of each sample by comparator 36 generates a single bit of data which forms a part of the bit stream that is fed to the decimator 14 to be filtered to form a 20 KHz output.

Figure 4:
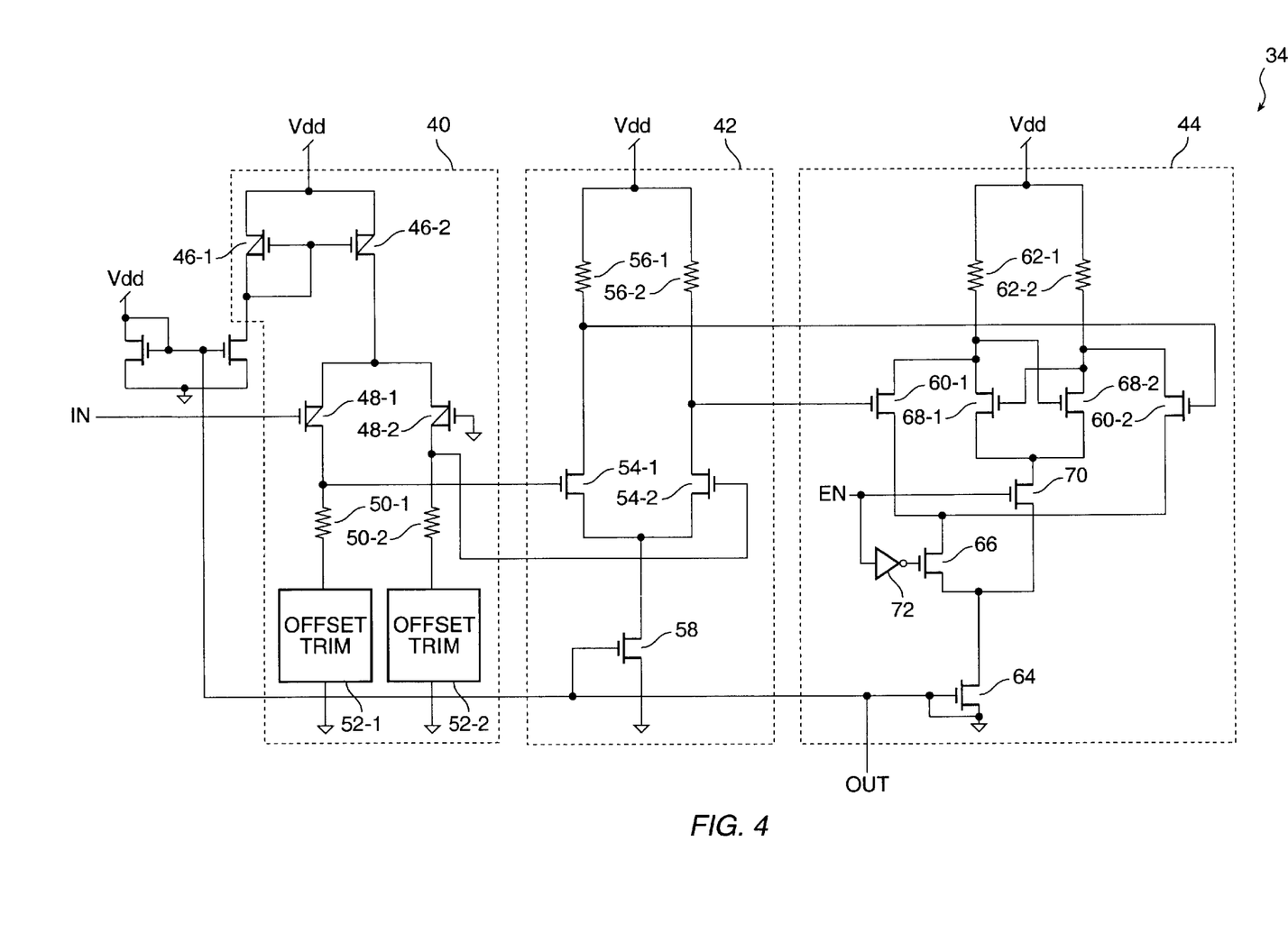
FIG. 4 illustrates the circuit diagram of a comparator suitable for use according to the present invention.

In FIG. 4 a simplified schematic diagram of a comparator 34 suitable for use in the modulator 12 according to the present invention is illustrated. Comparator 34 includes first and second gain stages, 40 and 42, respectively, and a latched comparator stage 44. First gain stage 40 is a differential amplifier fed in a single ended manner well known to those of ordinary skill in the art, and gain stage 42 is a double-ended differential amplifier also well known to those of ordinary skill in the art.

Gain stage 40 includes a P-channel MOS transistor current mirror pair 46-1 and 46-2 providing a current source to a P-channel MOS transistor differential pair 48-1 and 48-2 connected to a pair of load resistors 50-1 and 50-2, respectively, having offset trim networks 52-1 and 52-2, respectively. The inverting input node of comparator 34, depicted in FIG. 3, is represented by the gate of P-channel MOS transistor 48-1, and the non-inverting input node of comparator 34, depicted in FIG. 3, is connected to a reference voltage, which in the preferred embodiment is ground.

In gain stage 42, the gates of an N-channel MOS differential transistor pair 54-1 and 54-2 are connected to the outputs of gain stage 40, the drains of N-channel MOS differential transistor pair 54-1 and 54-2 are connected to resistor loads 56-1 and 56-2, respectively, and the sources of N-channel MOS differential transistor pair 54-1 and 54-2 are connected to the drain of N-channel MOS transistor 58. The operation of gain stages 40 and 42 is well understood by those of ordinary skill in the art, and will not be described herein to avoid overcomplicating the disclosure, and thereby obscuring the present invention.

In the latched comparator 44, the outputs of gain stage 42 are connected to the gates of a N-channel MOS differential transistor pair 60-1 and 60-2. The drains of N-channel MOS differential transistor pair 60-1 and 60-2 are connected to resistive loads 62-1 and 62-2, respectively, and the sources of N-channel MOS differential transistor pair 60-1 and 60-2 are connected to the drain of N-channel MOS transistor 64 through N-channel MOS transistor 66. Also connected to resistive load 62-1 nd 62-2 is a cross-coupled N-channel MOS transistor pair 68-1 and 68-2. In the cross-coupled N-channel MOS transistor pair 68-1 and 68-2, the drain of N-channel MOS transistor 68-1 and the gate of N-channel MOS transistor 68-2 are connected to the resistive load 62-1, and the drain of N-channel MOS transistor 68-2 and the gate of N-channel MOS transistor 68-1 are connected to the resistive load 62-2. The sources of N-channel MOS transistors 68-1 and 68-2 are connected an N-channel MOS pass transistor 70.

In the operation of latched comparator stage 44, when the comparison is made by applying an enable signal to the gate of N-channel MOS transistor 70, and to the gate of N-channel MOS transistor 66 through inverter 72, the N-channel MOS differential transistor pair 60-1 and 60-2 is cut off from the input to the latched comparator stage 44 by the action of N-channel MOS transistor 66, and the cross-coupled N-channel MOS transistor pair 68-1 and 68-2 amplify the small voltage differential at the input to the latched comparator stage 44.

It should be appreciated by those of ordinary skill in the art that the N-channel MOS current mirror transistor pair 74-1 and 74-2 provide bias to the first and second gain stages 40 and 42, and to the latched comparator stage 44. It should be further appreciated, that hysteresis may be provided to the output of comparator 34 to reduce "chatter" as is understood by those of ordinary skill in the art. The reduction of chatter is important because it reduces power consumption.

Figure 5:
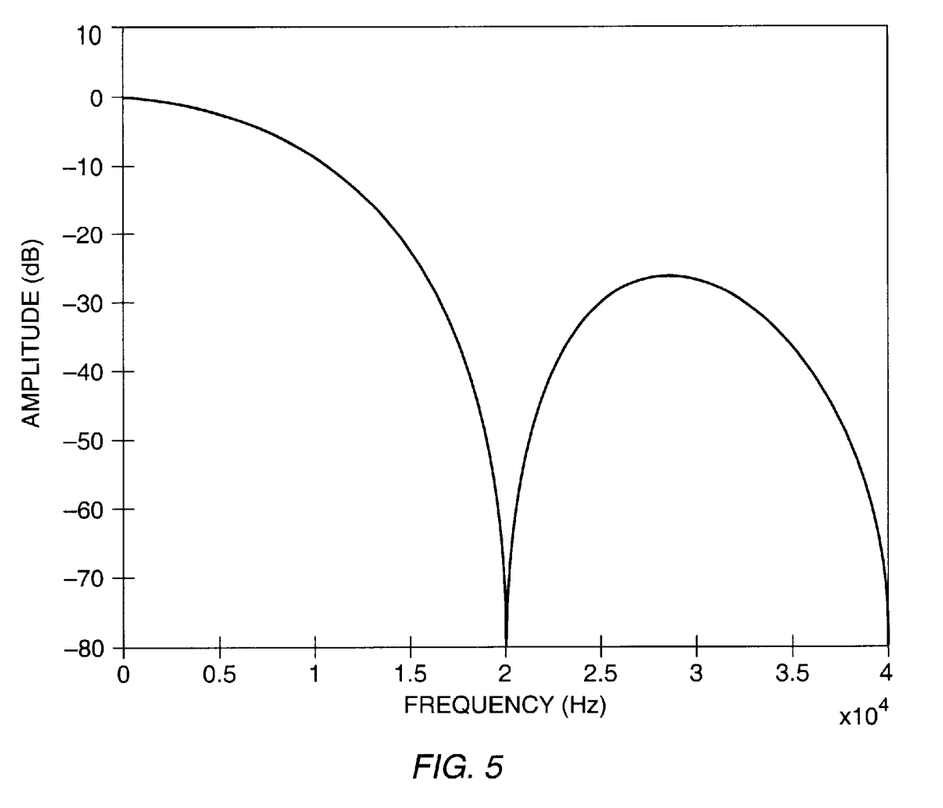
FIG. 5 illustrates the graph of a second order comb filter suitable for use according to the present invention.

Turning now to FIG. 5, the decimator 14, according to the present invention, implements the second order comb filter illustrated therein. The comb filter shown in FIG. 5 has the following transfer function:

$$H(Z) = \left(\sum_{i=0}^{N-1} Z^{-i}\right)^2 = \left(\frac{1}{N} \frac{1-Z^{-N}}{1-Z^{-1}}\right)^2$$

where N is the decimation factor. According to the present invention, the decimation factor, N, is 64. The frequency response of the decimator 14 is described by the following second order sinc function:

$$H(jW) = \left(\frac{\sin(WNT)}{N \times \sin(WT)}\right)^2$$

Figure 6:
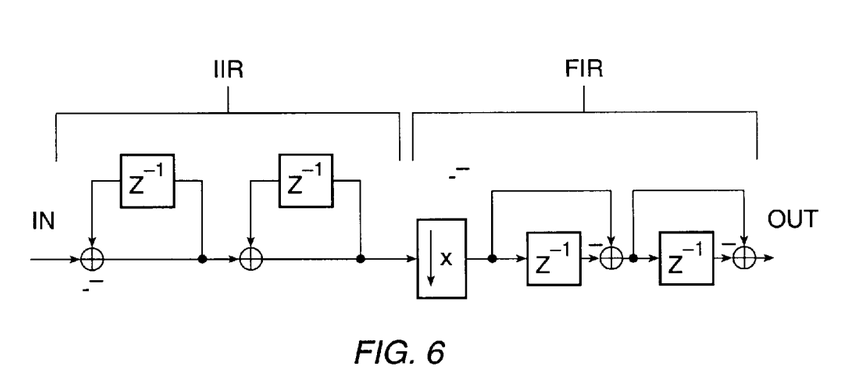
FIG. 6 illustrates a control flow graph to implement the second order comb filter depicted in FIG. 5.

The implementation of the decimator 14 transfer function is depicted in FIG. 6. The control flow graph is split into first and second parts. A first part implements an infinite impulse response (IIR) realizing the quantity $1/(1-Z^{-1})^2$, and a second part implementing a finite impulse response (FIR) realizing the quantity $(1-Z^{-N})^2$. It should be appreciated by those of ordinary skill in the art that the quantity $Z^{-N}$ can be replaced in the FIR by $Z^{-1}$ by down sampling the output from the IIR by N.

The recursive portion of the filter structure in FIG. 6 has a pole at Z=1 that is not asymptotically stable and may cause overflow. According to the present invention, this potential for overflow is avoided by employing modulo arithmetic. In the decimeter 14 according to the present invention, the modulo is implemented as being greater than $(2^{12}+1) \times 2^6$.

Figure 7:
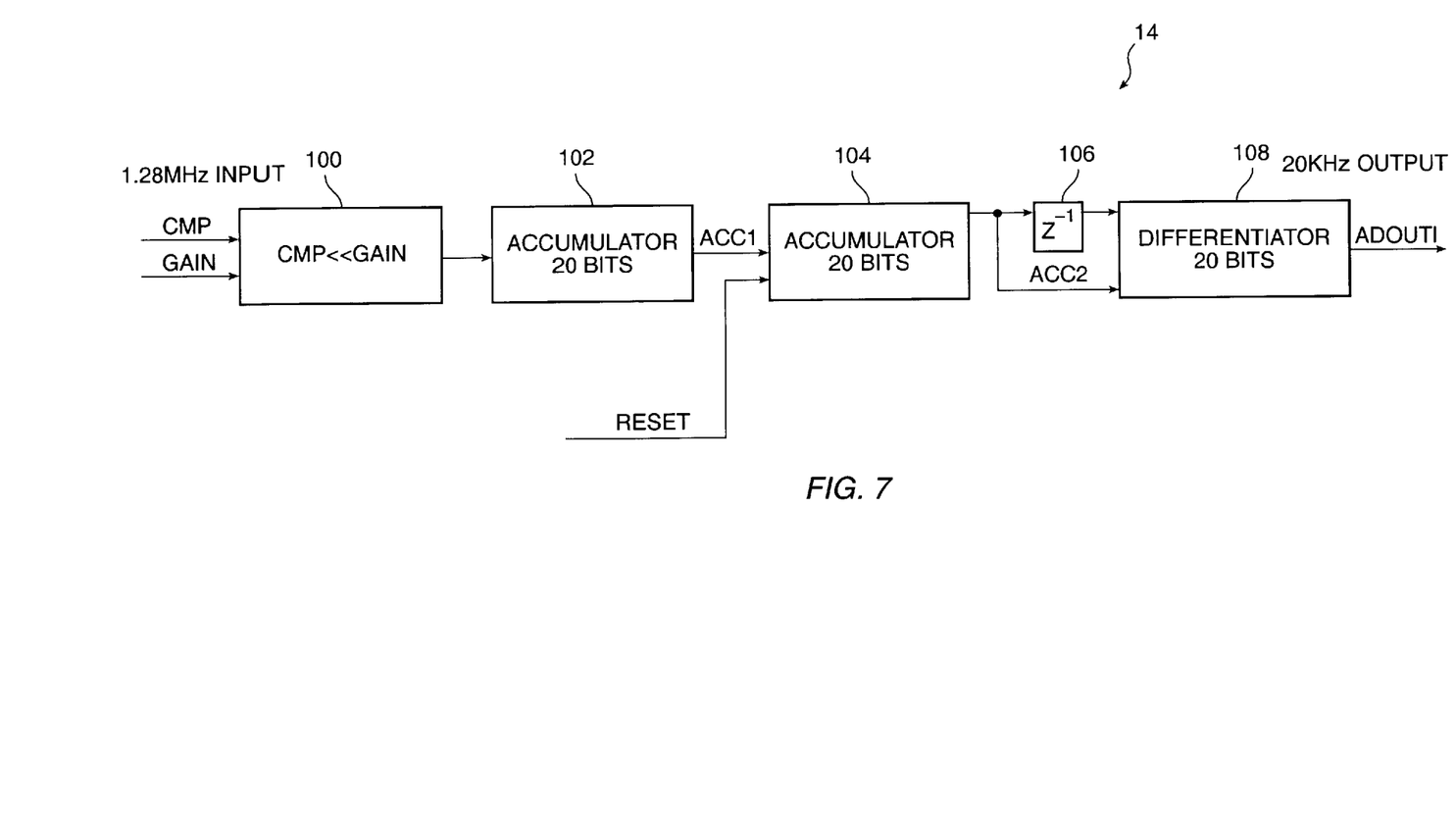
FIG. 7 illustrates a block diagram implementing the control flow graph depicted in FIG. 6 according to the present invention.

In FIG. 7, a block diagram of the implementation of the control flow graph, according to the present invention, is illustrated. In the block diagram of decimator 14, the bit stream from the modulator 12 and the gain from the PGC circuit 18 are input to a shift compare circuit 100. In the shift compare circuit 100, the output of the modulator 12 is shifted by the amount of the gain from the PGC circuit 18. The output of shift compare circuit 100 is fed into first accumulator 102. The first accumulator 102 operates at 1.28 MHz, and implements the first stage in the IIR portion of the control flow graph depicted in FIG. 6.

The output of first accumulator 102 is fed into second accumulator 104. Second accumulator 104 implements the second stage of the IIR portion of the control flow graph, and also the first stage of the FIR portion of the control flow graph wherein the output of the IIR portion of the control flow graph is down sampled by 64. The second accumulator 104 operates at 1.28 MHz, output signals at 20 KHz, and resets at 20 KHz. The output of the second accumulator 104 is fed into a delay circuit 106 and also to a differentiator 108.

The differentiator 108 subtracts the current output of second accumulator 104 from the immediately previous output of second accumulator 104 which has been delayed by delay circuit 106. The differentiator 108 also operates at 20 KHz. The output of differentiator 108 forms the output of the decimator 14 which is connected to normalizer 16. According to the preferred embodiment of the present invention, both the first and second accumulators 102 and 104, respectively, and the differentiator 108 operate in the same arithmetic modulo base. The implementation of first and second accumulators 102 and 104, respectively, delay circuit 106, and differentiator 108 is well within the level of those of ordinary skill in the art, and accordingly will not be disclosed herein.

Figure 8:
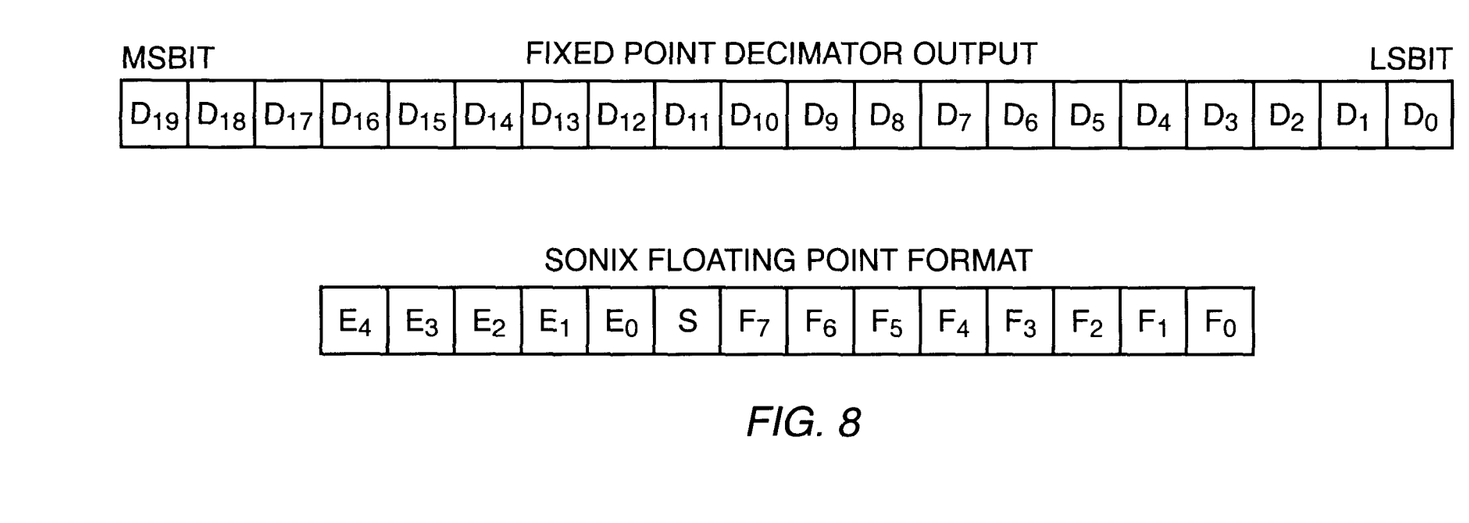
FIG. 8 illustrates fixed and floating point number representations according to the present invention.

The conversion of 20 bit fixed point number output of decimator 14 into a 14 bit floating point number is performed by normalizer 16. The formats of both the 20 bit fixed point number output of decimator 14 and the converted 14 bit floating point number are illustrated in FIG. 8. In the conversion of the 20 bit fixed point number to the 14 bit floating point number, the sign bit S in the 14 bit floating point number is the same as bit $D_{19}$ in the 20 bit fixed point number. The exponent of the 14 bit floating point number represented in 2's compliment form is calculated as follows:

$$E=7-(18-P);$$

wherein P is the position of the most significant "1" in the 20 bit fixed point number, when bit $D_{19}$ is a "0", and P is the position of the most significant "0" in the 20 bit fixed point number when bit $D_{19}$ is a "1". The mantissa of the 14 bit floating point number represented by bits $F_{7:0}$ is mapped from the bits $D_{(P-1):(P-8)}$ in the 20 bit fixed point number. It should be appreciated that if P is less than 8 then the least significant bits of the mantissa which cannot be mapped from the 20 bit fixed point number are all "0's".

Figure 9:
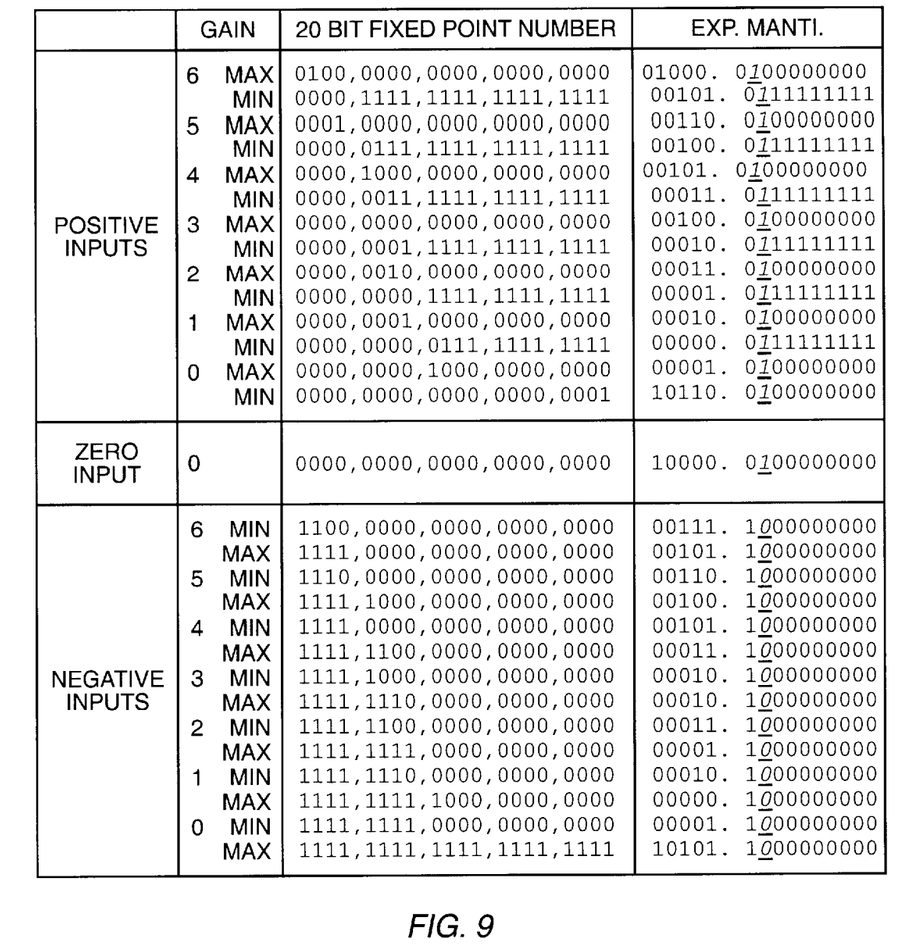
FIG. 9 the mapping of the 20 bit fixed point numbers to 14 bit floating point numbers according to the present invention.

The value of the 14 bit floating point number, when S is equal to 0 is $01.F \times 2^{EXP}$, and when S is equal to 1 is $10.F \times 2^{EXP}$. It should be appreciated that when bits $D_0$ through $D_{19}$ are all "0", then the value of the 14 bit floating point number is equal to 0. In FIG. 9, the maximum and minimum 20 point fixed point outputs for both positive and negative inputs are illustrated along with the mapping of the 20 bit fixed point numbers to the 14 bit floating point numbers.

Figure 10:
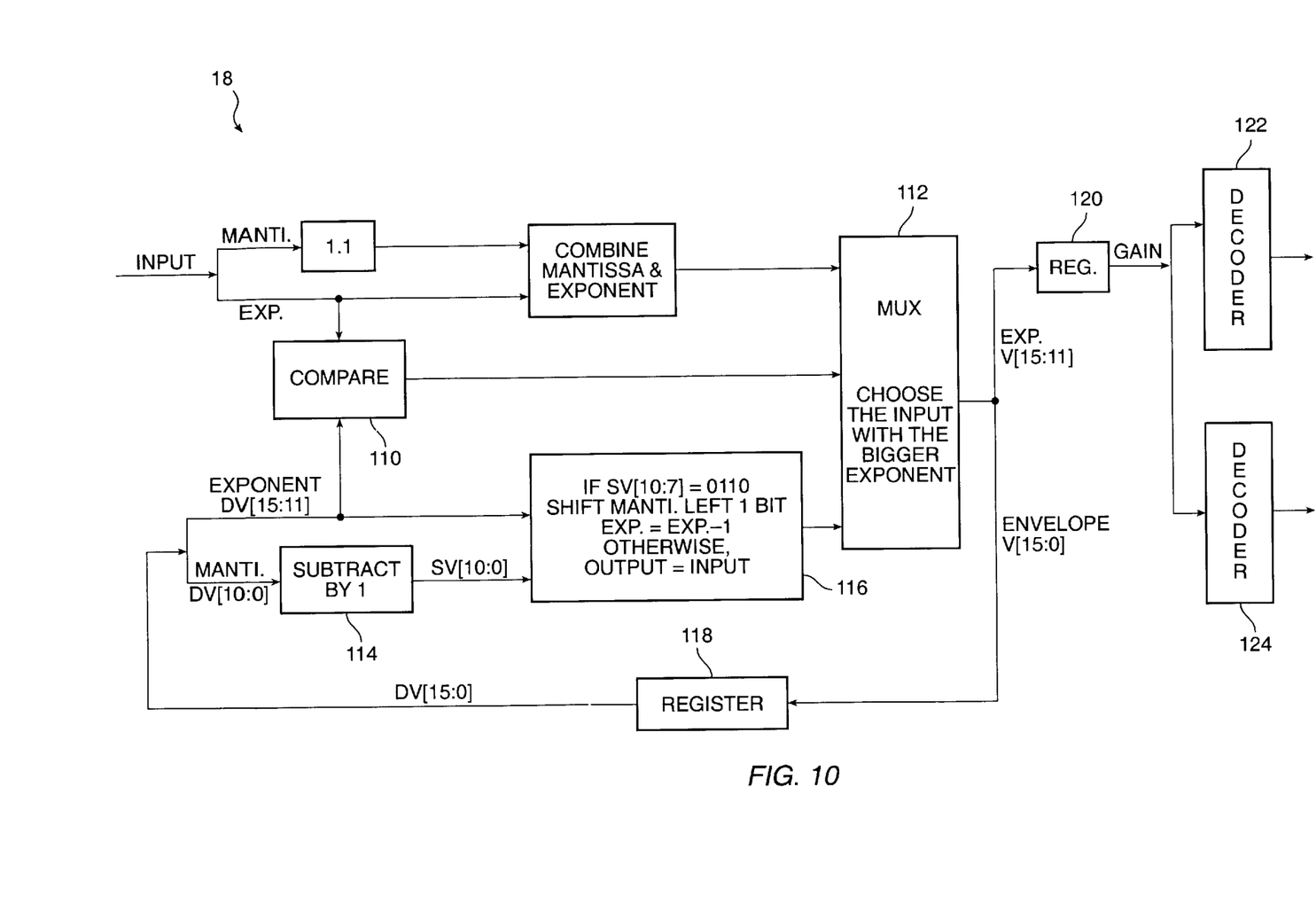
FIG. 10 illustrates a block diagram of a programmable gain control circuit according to the present invention.

Turning now to FIG. 10, a block diagram of the PGC circuit 18 is illustrated. In the PGC circuit 18, the five bit exponent value (EXP) of the 14 bit floating point number representing the input signal is compared to a five bit exponent value (DV 10:14) derived from previous input samples and referred to as the exponent of the envelope. The comparison is performed by compare circuit 110 to determine whether the exponent of the input signal or the exponent of the envelope has a larger value.

The implementation of a compare circuit 110 suitable for use in the present invention is well within the skill level of one of ordinary skill in the art and, accordingly, will not be described herein in detail. As a result of the comparison, the compare circuit 110 will generate a selection signal for MUX 112 to select between the 14 bit floating point input signal and the 14 bit floating point envelope. The input with the largest exponent as determined by the compare circuit 110 will be selected by the MUX 112. The selected input will form the new envelope of the input signal.

After the 5 bit exponent of the input signal is used for comparison by the compare circuit 110, the 9 bit mantissa and the 5 bit exponent of the input signal are combined to form a first input to MUX 112. When the 5 bit exponent of the envelope is separated from the 9 bit mantissa of the envelope, a value of "1" is subtracted from the 9 bit mantissa of the envelope by the subtract circuit 114.

In the mantissa compare and shift circuit 116, bits 6 thorough 9 of the mantissa of the envelope output from the subtract circuit 114 are compared to the bit string "0110". When there is a match, the 9 bit mantissa is shifted left one bit. This causes the value of the 5 bit exponent from the envelope which has been combined with the 9 bit mantissa of the envelope in the mantissa compare and shift circuit 36 to be reduced by "1". The 14 bit floating point envelope is then input to the second input of the MUX 112. Otherwise, if there is no match, the 14 bit floating point envelope without a bit shift left of one in the mantissa of the envelope is input to the second input of MUX 112.

The operation of the PGC circuit 18 adjusts the gain in the modulator 12 in response to the envelope of the analog input signal. The envelope detection using the exponent of the input signal in the PGC circuit 14 is instantaneous during attack to avoid clipping and a slow during release to avoid modulation. During attack, when the exponent of the input is larger than the exponent of the envelope, the exponent of the envelope is replaced by the absolute value of the exponent of the input signal and the gain in the modulator is reduced during the next sample.

During release, when the exponent of the input signal is less than the exponent of the envelope, the mantissa of the envelope is decremented by "1". As described above, when the mantissa of the envelope is decremented from a maximum value of (11,1111,1111) to (01,1011,1111) the mantissa is shifted left once so that the exponent of the envelope is decreased by "1". The decrease in the exponent results in an increase in the gain to the modulator 12 to increase the length of the release time. Accordingly, the release time is not constant, but rather is determined by the mantissa and a threshold represented by bits 6 through 9 in the mantissa.

Figure 11:
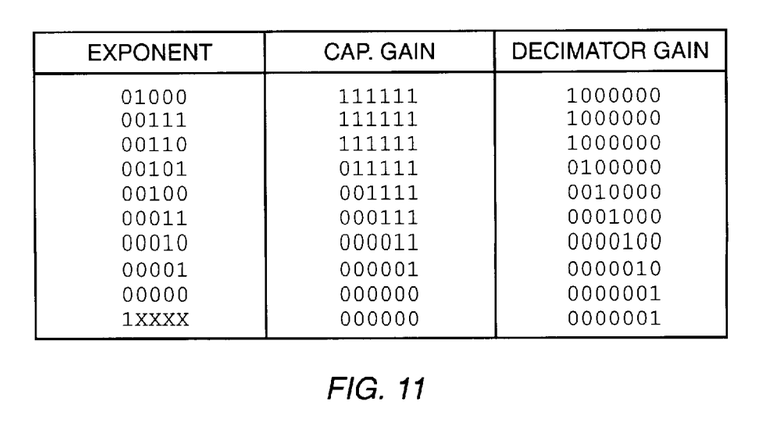
FIG. 11 illustrates the decoding sequences from the programmable gain control circuit according to the present invention.

As discussed above, the 14 bit floating input selected by MUX 112 as a result of the compare operation by compare circuit 110, is output to a first register 118 for use as the 5 bit exponent and 9 bit mantissa of the envelope during the next sampling cycle. The 5 bit exponent is also output by MUX 112 to a second register 120. The output of second register 120 is connected to first and second decoders 122 and 124. The output of decoder 122 is connected to the modulator 12, and the output of decoder 124 is connected to the decimator 14. Each of the decoders 122 and 124 provide a six bit output. The output of decoder 42 sets the gain in the modulator 12 by controlling the bank of switches 38-1 through 38-9 set forth in FIG. 3, and the output of decoder 124 controls the gain in the decimator 14. The six bit decoder 122 and 124 outputs from the 5 bit exponent input are set forth in FIG. 11.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. An analog-to-digital converter comprising:

a modulator including:

a comparator having a first input, a second input, and an output;

a reference potential connected to said first input of said comparator and connectable to said second input of said comparator by first switch;

an input storage element having a first terminal connected to an input of said analog-to-digital converter, and a second terminal connectable to said second input of said comparator by a second switch;

a first bank of storage elements, each of said storage elements having a first terminal connected to said second input of said comparator, and a second terminal connected to a separate switch in a bank of switches, said bank of switches making selected ones of said storage elements connectable to either a charge or discharge potential;

a decimator including:

a shift register having a first input connected to said comparator output, and a second input connected to a feedback gain proportional to an output of said analog-to-digital converter to control said shift register, and an output;

a first accumulator having an input connected to said output of said shift register, and an output;

a second accumulator having an input connected to said output of said first accumulator, and an output;

a delay element having an input connected to said output of said second accumulator, and an output;

a differentiator having a first input connected to said output of said delay element and a second input connected to said output of said second accumulator, and an output;

a normalizer having an input connected to said output of said decimator for mapping said decimator output from a first number format to a second number format at an output; and a programmable gain control circuit having an input connected to said output of said normalizer, and a first output connected to said bank of switches in said modulator to adjust the gain in said modulator, and a second output connected to said decimator to adjust said gain of said decimator.

2. A modulator comprising:

a comparator having a first input, a second input, and an output;

a reference potential connected to said first input of said comparator and connectable to said second input of said comparator by a first switch;

an input storage element having a first terminal connected to an input of said modulator, and a second terminal connectable to said second input of said comparator by a second switch;

a first bank of storage elements, each of said storage elements having a first terminal connected to said second input of said comparator, and a second terminal connected to a separate switch in a bank of switches, said bank of switches making selected ones of said storage elements connectable to either a charge or discharge potential.

* * * * *